United States Patent [19]

Boenning

[11] Patent Number: 4,815,077
[45] Date of Patent: Mar. 21, 1989

[54] TEST SYSTEM FOR ELECTRONIC DEVICES WITH RADIO FREQUENCY SIGNATURE EXTRACTION MEANS

[75] Inventor: Robert A. Boenning, Timonium, Md.

[73] Assignee: Westinghouse Electric Corp., Pittsburgh, Pa.

[21] Appl. No.: 8,031

[22] Filed: Jan. 28, 1987

[51] Int. Cl.$^4$ .............................................. G01R 3/28
[52] U.S. Cl. ...................................................... 371/25
[58] Field of Search ............... 371/25; 20; 324/73 PC, 324/73 R, 158 R, 158 F, 158 P

[56] References Cited

U.S. PATENT DOCUMENTS

| | | | |
|---|---|---|---|
| 3,975,680 | 8/1976 | Webb | 324/73 PC |
| 4,176,780 | 12/1979 | Sacher et al. | 371/25 |
| 4,488,301 | 12/1984 | Nasuta et al. | 371/25 |
| 4,510,572 | 4/1985 | Reece et al. | 371/25 X |
| 4,583,042 | 4/1986 | Riemer | 324/73 PC |
| 4,622,652 | 11/1986 | Zumchak et al. | 364/900 |
| 4,709,366 | 11/1987 | Scott et al. | 371/20 |

Primary Examiner—Charles E. Atkinson
Attorney, Agent, or Firm—R. P. Lenart

[57] ABSTRACT

A test system for comparatively analyzing a complex signal indicative of the operational status of an electronic device to be tested includes means for sampling a signal whose characteristics are indicative of the unknown operational status of the electronic device to produce a comparison data base. The comparison data base is processed to produce comparison transform coefficients. These transform coefficients are compared with a set of reference transform coefficients, representative of a desired operational status of the device, to determine the actual operational status of the device. The sampling means includes a conductive element capacitively coupled to the device and permanently mounted in a fixed spatial relationship with the device.

2 Claims, 2 Drawing Sheets

TEST SYSTEM FOR ELECTRONIC DEVICES WITH RADIO FREQUENCY SIGNATURE EXTRACTION MEANS

BACKGROUND OF THE INVENTION

This invention relates to test systems for electronic devices and, more particularly, to such systems which measure the radio frequency signature of the devices under test and compare this signature to a reference signature to determine the operational status of the device.

Operating unshielded electronic devices, such as integrated circuits, emit an electromagnetic field which may be detected and utilized to determine the operational status of the devices. A radio frequency signature analysis system for determining the functional status of integrated circuit chips has been demonstrated, under laboratory conditions, to be able to detect one faulty circuit device in 8,192. That system utilizes a capacitive pickup probe which is placed by hand on the operating integrated circuit and captures a snapshot of the radio frequency field emitted by the integrated circuit during a defined interval. This field signal is digitized, and processed utilizing a Walsh-Hadamard transform and stored as an N-dimensional vector (N=1024 in the laboratory system) signature representative of the composite radiated field from the individual operating device. Signatures from suspect integrated circuits can be compared with those of known good integrated circuits to identify improperly operating devices. Such a test system is disclosed in U.S. Pat. No. 4,488,301, issued Dec. 11, 1984, which is hereby incorporated by reference.

The present laboratory version of the test system described in U.S. Pat. No. 4,488,301 uses a hand-held capacitive probe to detect the radio frequency field emitted by an operating integrated circuit. The use of such a probe causes repeatability problems resulting from slight variations in the position of the conductive pickup plate in the probe. Although a holding fixture which precisely positions the pickup probe can result in improved repeatability, such a fixture is only practical for shops, depots, or automated inspection and test stations.

It is therefore desirable to provide such a test system with a signature signal pickup means which provides improved reliability and can be used in a wider range of test environments.

SUMMARY OF THE INVENTION

The present invention includes a test system for comparatively analyzing a complex signal indicative of the operational status of an electronic device which comprises means for sampling a signal whose characteristics are indicative of an unknown operational status of an electronic device to produce a comparison data base. This comparison data base is then processed to produce a plurality of comparison transform coefficients which are compared with a plurality of reference transform coefficients, representative of a desired operational status of the device, to determine the actual operational status of the device. The signal sampling means includes a conductive element which is capacitively coupled to the electronic device and permanently mounted in a fixed spatial relationship with the device.

In its preferred embodiment, the sampling means includes a small, thin metal plate or metallic tape, which is attached to the case of an electronic device, such as an integrated circuit, either on the surface or within the case. Alternatively, a metallized surface could be added to the electronic device during manufacture to serve as a capacitive pickup plate.

By using a conductive element which is capacitively coupled to the device under test and is permanently mounted in a fixed spatial relationship with the device, this invention seeks to provide improved repeatability, the ability to probe a printed circuit board while in place in a card rack, the potential for achieving built in tests for each integrated circuit device on a printed circuit board without having to include built in test circuitry on the integrated circuit chips, and access to a radio frequency field signature by a test bus for incipient failure detection and built in test purposes.

DESCRIPTION OF THE PREFERRED EMBODIMENT

Figure 1:
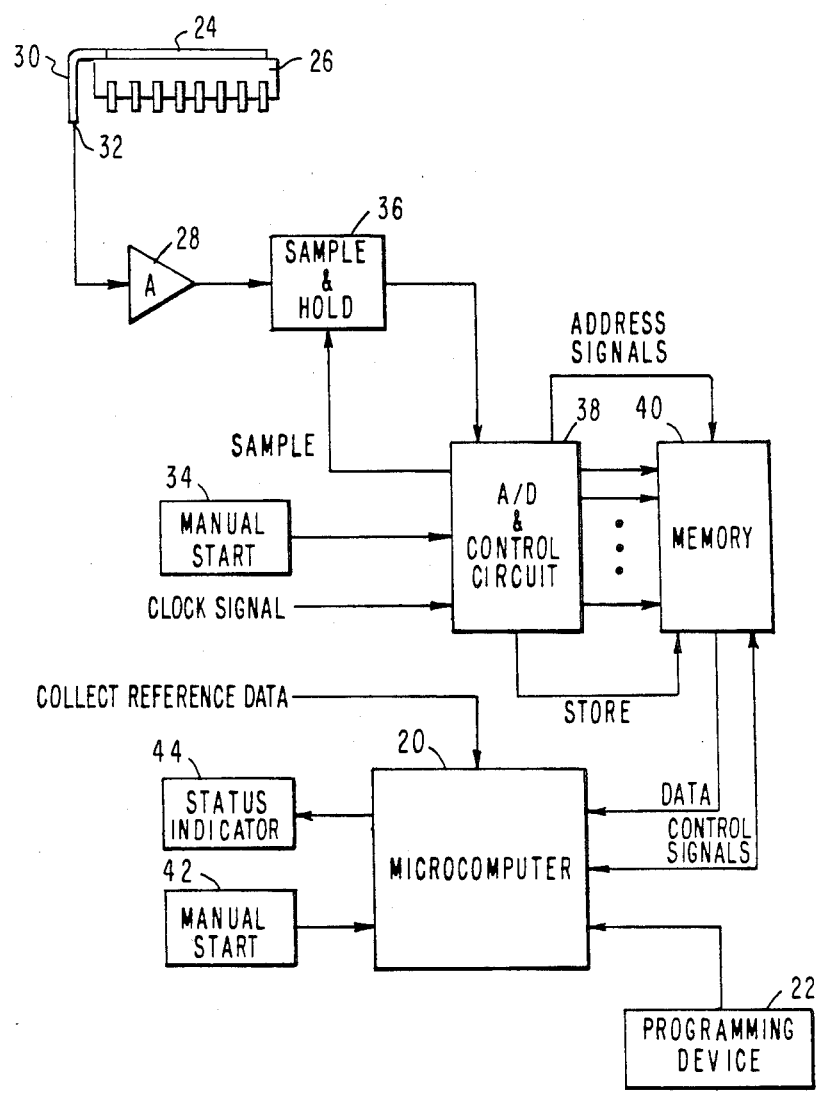
FIG. 1 is a block diagram of a test system constructed in accordance with the preferred embodiment of this invention.

Referring to the drawings, FIG. 1 is a block diagram of a test system constructed in accordance with the preferred embodiment of the present invention. In this embodiment, a conventional microprocessor 20 is coupled to receive operating programs and data from a conventional programming device 22. A signal sampling means in the form of a conductive plate 24, permanently attached to the top surface of an insulating case 26 of an integrated circuit is used to couple an electromagnetic signal, such as a radio frequency signal, indicative of the operational status of the integrated circuit to the input of a buffer amplifier 28. A tab 30 which extends from one end of the conductive element 24 provides a means for attaching a point contact 32 to couple the signal to the input of the buffer 28.

Activation of a manual start apparatus 34 initiates a data collection cycle. Following initiation of the data collection cycle, a sample and hold amplifier 36 is periodically enabled by a control signal from the analog-to-digital converter and control circuit 38 to produce at the output of this amplifier, a stable analog signal representative of the output signal from the capacitive pickup plate 24 at a preselected sampling interval. The sampling interval is synchronized by a clock signal from the device being tested. An analog-to-digital converter is coupled to receive the output signal from the sample and hold amplifier 36 and to generate a digital number representative of the amplitude of each of the stable analog samples. These digital numbers are stored at predetermined storage locations in a random access digital memory 40. After a predetermined number of samples, for example, 1,024, have been stored, the data collection cycle is automatically terminated.

After completion of the data collection cycle described above, a microprocessor manual start apparatus 42 is activated to initiate the microprocessor 20 to process the stored data in the random access digital memory 40. A digital collect reference data signal coupled to the microprocessor 20 determines whether the data stored in memory 40 is processed as the reference data base or as a comparison data base.

To initiate a test, the clock signal, preferably the basic timing signal for the integrated circuit, is coupled to the analog-to-digital converter and control circuitry 38. The state of the digital collect reference data signal is selected to indicate that the reference data set is to be collected. Manual start circuit 34 is activated to initiate a data collection cycle to fill all locations in the memory 40 to generate the reference data base. After the data samples forming the referenced data base have been stored in the memory 40, the manual start circuit 34 is operated, causing microprocessor 20 to read the data stored from the memory 40 and calculate the Walsh transform coefficients of this data. The resulting Walsh transform coefficients are stored in the internal memory of the microprocessor 20 as the reference Walsh transform coefficients.

Next the point contact 32 is moved to a new capacitive pickup conductive element which is permanently attached to the case of an electronic device which is to be tested and a suitable clock signal is provided to the analog-to-digital converter and control circuit 38 and the manual start apparatus 34 is activated to initialize the analog-to-digital converter and control circuit 38 to collect and store data samples in the memory 40 to generate a comparison data base. After the data samples of the comparison data base have been stored in the memory 40, the status of the digital collect reference data signal is changed and the manual microprocessor start apparatus 34 is activated, thereby causing microprocessor 20 to calculate the Walsh transform coefficients of the comparison data base now stored in memory 40. The resulting Walsh transform coefficients are compared to the reference Walsh transform coefficients and if the difference between these two sets of transform coefficients exceeds a predetermined reference level, a signal is coupled to the status indicator 44 to provide an indication that the current operational status of the device being tested fails to meet the predetermined criteria which usually indicates a circuit malfunction. The comparison cycle and data processing performed by the circuits of FIG. 1 is described in greater detail in U.S. Pat. No. 4,448,301 which has been incorporated by reference.

Figure 2A:
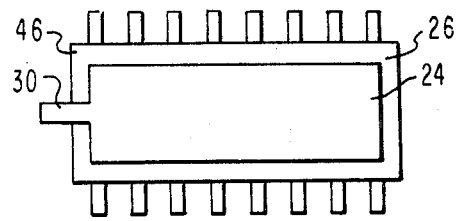
FIGS. 2A, 2B and 2C are top, side and end views of an electronic device having a conductive capacitive pickup plate constructed in accordance with one embodiment of this invention.
Figure 2B:
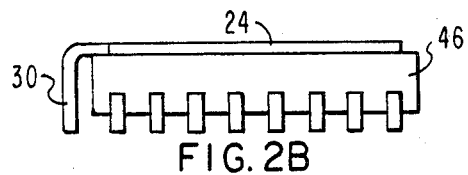
Figure 2C:
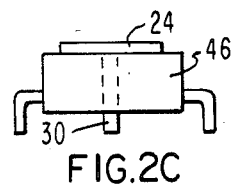

FIGS. 2A, 2B and 2C show top, side and end views of a dual in-line package integrated circuit 46 having a conductive element 24 permanently mounted in a fixed spatial relationship with the integrated circuit chip within the package in accordance with one embodiment of the present invention. In this embodiment, a generally flat conductive element 24, which may be a metal plate, foil or tape, is rigidly attached, for example, by an adhesive to the top surface of the integrated circuit 46. A tab 30 extends from one end of the conductive element 24 and is bent for insertion into an opening in a printed circuit board. This tab can serve as means for electrically connecting the conductive element to a sampling circuit. Alternatively, connection to the sampling circuit may be made by way of a point contact probe which is merely pressed against the top surface of the conducting element 24.

Figure 3A:
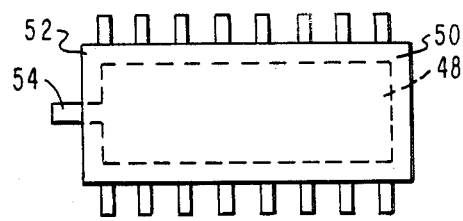
FIGS. 3A, 3B and 3C are top, side and end views of an electronic device including an alternative embodiment of the capacitive pickup plate of FIG. 2.
Figure 3B:
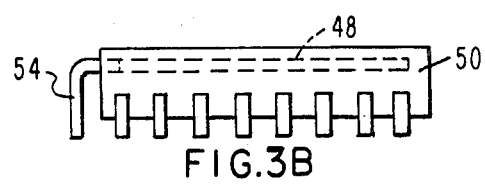
Figure 3C:
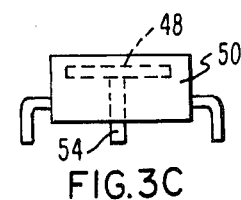

FIGS. 3A, 3B and 3C are top, side and end views of an alternative embodiment of the sampling means for this invention wherein the conductive element 48 is embedded within an insulating package 50 of a dual in-line integrated circuit 52. A tab 54 extends from the conductive element 48 through an external surface of the insulating circuit package.

Figure 4A:
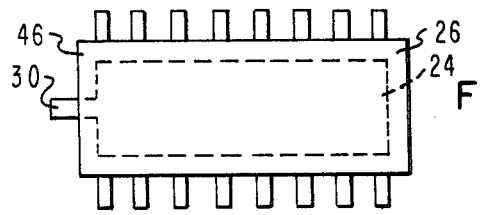
FIGS. 4A, 4B and 4C are top, side and end views of an electronic device including yet another embodiment of the capacitive pickup plate.
Figure 4B:
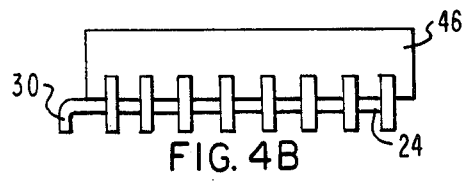
Figure 4C:
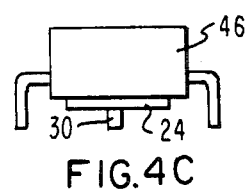

Another alternative embodiment of the sampling means is shown in FIGS. 4A, 4B and 4C wherein the conductive plate 24 of FIG. 2A has been attached to the bottom of the integrated circuit case.

It should be apparent that the conductive plate or metallized surface rigidly attached to the device under test provides the function of the pickup plate in the hand-held probe of the test system disclosed in U.S. Pat. No. 4,488,301. By using a capacitive pickup element which is permanently mounted in a fixed spatial relationship with the electronic device being tested, consistent results may be obtained by making a single electrical contact with a test pin or tab, either by touching the conductive element or tab with a probe or by a hard wire connection through a printed circuit board connector. If extraneous circuit coupling to the conductive element is undesirable, the conductive element may be grounded during normal operation of the circuit.

The inclusion of a permanently attached capacitive pickup plate on integrated circuit could provide means for rapid, low cost incoming inspection using radio frequency signature analysis. The signature for a properly operating device could be supplied with the device, along with a standardized test sequence. This could reduce the need for costly conventional chip testers.

Although the present invention has been described in terms of what are at present believed to be its preferred embodiments, it will be apparent to those skilled in the art that various changes may be made without departing from the scope of the invention. It is therefore intended that the appended claims cover such changes.

What is claimed is:

1. A test system for comparatively analyzing a complex signal indicative of the operational status of an electronic device to be tested comprising in combination:

means for sampling a signal whose characteristics are indicative of an unknown operational status of an electronic device to produce a comparison data base;

means for processing said comparison data base to produce comparison transform coefficients;

means for comparing said comparison transform coefficients with a plurality of reference transform coefficients representative of a desired operational status of said device to determine the actual operational status of said electronic device;

wherein said means for sampling said signal includes a conductive element capacity coupled to said electronic device and permanently mounted in a fixed spatial relationship with said electronic device;

a sampling circuit;

means for electrically connecting said sampling circuit to said conductive element;

wherein said conductive element is embedded in an insulating housing of said electronic device; and wherein said means for electrically connecting comprises a tab electrically connected to said conductive element and extending through an external surface of said insulating housing.

2. A test system for comparatively analyzing a complex signal indicative of the operational status of an electronic device to be tested comprising in combination:

means for sampling a signal whose characteristics are indicative of an unknown operational status of an electronic device to produce a comparison data base;

means for processing said comparison data base to produce comparison transform coefficients;

means for comparing said comparison transform coefficients with a plurality of reference transform coefficients representative of a desired operational status of said device to determine the actual operational status of said electronic device;

wherein said means for sampling said signal includes a conductive element capacitively coupled to said electronic device and permanently mounted in a fixed spatial relationship with said electronic device; and wherein said conductive element is embedded in an insulating housing of said electronic device.

* * * * *